(12) United States Patent
Wai et al.

(10) Patent No.: US 7,582,561 B2
(45) Date of Patent: Sep. 1, 2009

(54) METHOD OF SELECTIVELY DEPOSITING MATERIALS ON A SUBSTRATE USING A SUPERCRITICAL FLUID

(75) Inventors: Chien M. Wai, Moscow, ID (US); Hiroyuki Ohde, Hiroshima (JP); Steve Kramer, Boise, ID (US)

(73) Assignees: Micron Technology, Inc., Boise, ID (US); Idaho Research Foundation, Inc., Moscow, ID (US)

( * ) Notice: Subject to any disclaimer, the term of this patent is extended or adjusted under 35 U.S.C. 154(b) by 412 days.

(21) Appl. No.: 11/218,347

(22) Filed: Sep. 1, 2005
(Under 37 CFR 1.47)

(65) Prior Publication Data
US 2007/0049019 A1 Mar. 1, 2007

(51) Int. Cl.
*H01L 21/44* (2006.01)
(52) U.S. Cl. .................. 438/672; 438/669; 438/778; 257/642; 257/E21.597
(58) Field of Classification Search ............... 438/669, 438/672, 778, 780; 257/642, 914, E21.597
See application file for complete search history.

(56) References Cited

U.S. PATENT DOCUMENTS

| | | | |
|---|---|---|---|
| 3,602,635 A * | 8/1971 | Romankiw | 174/253 |
| 6,426,116 B1 | 7/2002 | Sunol | |
| 6,432,724 B1 * | 8/2002 | Ahn et al. | 438/667 |
| 6,653,236 B2 | 11/2003 | Wai et al. | |
| 6,689,700 B1 | 2/2004 | Watkins et al. | |
| 6,715,498 B1 * | 4/2004 | Humayun et al. | 134/1.3 |
| 2002/0022362 A1 * | 2/2002 | Ahn et al. | 438/667 |
| 2003/0012931 A1 * | 1/2003 | Kuroda et al. | 428/188 |
| 2003/0157248 A1 * | 8/2003 | Watkins et al. | 427/256 |
| 2003/0161954 A1 | 8/2003 | Blackburn et al. | |
| 2004/0266219 A1 * | 12/2004 | Sarigiannis et al. | 438/778 |
| 2005/0136292 A1 * | 6/2005 | Mariani et al. | 428/702 |
| 2005/0191861 A1 * | 9/2005 | Verhaverbeke | 438/745 |

FOREIGN PATENT DOCUMENTS

WO     WO 01/32951 A2     5/2001

OTHER PUBLICATIONS

"Porous silicates inspired by nature: Fabrication and Processing" Materials Today, vol. 7, Issue 3, p. 18, Mar. 2004.

(Continued)

*Primary Examiner*—Phuc T Dang
(74) *Attorney, Agent, or Firm*—Dinsmore & Shohl LLP

(57) ABSTRACT

A method for depositing one or more materials on a substrate, such as for example, a semiconductor substrate that includes providing the substrate; applying a polymer film to at least a portion of a surface of the substrate; and exposing the semiconductor substrate to a supercritical fluid containing at least one reactant for a time sufficient for the supercritical fluid to swell the polymer and for the at least one reactant to penetrate the polymer film. The reactant is reacted to cause the deposition of the material on at least a portion of the substrate. The substrate is removed from the supercritical fluid, and the polymer film is removed. The process permits the precise deposition of materials without the need for removal of excess material using chemical, physical, or a combination of chemical and physical removal techniques.

33 Claims, 2 Drawing Sheets

OTHER PUBLICATIONS

Brown, G.D., et al., "Carbon dioxide-dilated block copolymer templates for nanostructured materials," Materials Research Society Symposium Proceedings, vol. 584, pp. 169-174, Dec. 1999.

Watkins, James et al., "Supercritical Fluid Technology for Semiconductor Device Fabrication Deposition of Metals and Mesoporous Silicates from Carbon Dioxide," Presentation Abstract University of Arizona.

Wilson, Elizabeth K., "Materials Made Under Pressure," Chemical & Engineering News: Science/Technology, vol. 78, No. 51, pp. 34-36, Dec. 18, 2000.

* cited by examiner

METHOD OF SELECTIVELY DEPOSITING MATERIALS ON A SUBSTRATE USING A SUPERCRITICAL FLUID

BACKGROUND OF THE INVENTION

The invention relates to processes for selectively depositing materials on a substrate using a supercritical fluid, and more particularly to processes for depositing materials on a semiconductor substrate using a supercritical fluid.

As the demand for ever-smaller silicon devices continues, and as resolution continues below the sub-micron level, the need for uniform and precise processes for depositing conductive pathways and interconnects is increasing. It is also desirable for such processes to proceed rapidly. For example, it is frequently desired to form metal-containing materials in and on semiconductor substrates. The metal-containing materials can be incorporated into integrated circuit devices, and/or can be utilized for formation of conductive interconnects between integrated circuit devices.

Wai et al, U.S. Pat. No. 6,653,236, describe methods of forming metal containing films over surfaces of semiconductor substrates using a supercritical fluid that contains metal forming precursors dispersed therein. A supercritical fluid is a composition that exists in a quasi-liquid state above a defined critical pressure and a critical temperature for the composition. For example, carbon dioxide becomes a supercritical fluid at temperatures above 31° C. and pressures above 1073 psi (73 atmospheres). Typical working conditions for supercritical $CO_2$ are in the range of from about 60-100° C. and 1500-4500 psi. The use of supercritical fluids permits much greater amounts of precursors and/or reactants to be dissolved or dispersed than prior CVD (chemical vapor deposition) processes.

Processes such as chemical vapor deposition and deposition in supercritical fluids result in the formation of conformal coatings. However, in most, if not all instances, excess deposited material must be removed by either physical or chemical planarization, or a combination of physical and chemical planarization, before further processing of the semiconductor structure can take place. This requirement adds additional steps to the fabrication process, especially where multiple deposits are made on the substrate during the semiconductor device fabrication process.

Accordingly, there remains a need in the art for processes that can provide conformal coatings and layers in a semiconductor fabrication process but which eliminate the need for chemical and/or physical planarization of the deposited material.

SUMMARY OF THE INVENTION

Embodiments of the present invention address this need by providing processes in which materials are conformally deposited to fill or cover a desired substrate topography to a precise depth or thickness without the need to remove excess deposited material using chemical and/or physical planarization techniques. More particularly, embodiments of the present invention utilize a removable polymer film which is porous to the deposition of materials from a supercritical fluid.

In accordance with one aspect of the present invention, a method for depositing one or more materials on a substrate is-provided and includes providing a semiconductor substrate, applying a polymer film to at least a portion of a surface of the substrate, and exposing the semiconductor substrate to a supercritical fluid containing at least one reactant for a time sufficient for the supercritical fluid to swell the polymer and for the at least one reactant to penetrate the polymer film. The at least one reactant is caused to react to deposit a material on at least a portion of the substrate. The substrate is removed from the supercritical fluid, and the polymer film is removed from the substrate.

The supercritical fluid may be selected from the group consisting of carbon dioxide, ammonia, $C_1$ through $C_5$ alcohols, $C_2$ through $C_8$ hydrocarbons, water, xenon, nitrous oxide, tetrafluoromethane, difluoromethane, tetrafluoroethane, pentafluoroethane, sulfur hexafluoride, CFC-12, HCFC-22, HCFC-123, HFC-116, HFC-134a, dimethylether, and mixtures thereof.

Preferably, the semiconductor substrate includes at least one trench, contact hole, or other topographic feature to be filled or coated. Where the feature is a contact hole, the material is deposited in the contact hole. The contact hole may be substantially filled with the deposited material. Optionally, the material can then be recessed so that the upper surface thereof is below the upper surface of the sidewall of the contact hole.

In preferred embodiments of the invention, the at least one reactant may comprise a metal-containing composition such as a metal-containing precursor, or a dielectric composition or a precursor to a dielectric composition. The metal-containing composition may include one or more of Al, Au, Co, Cr, Hf, In, Ir, Mo, Ni, Pt, Pd, Rh, Ru, Sn, Ta, Ti, W, and Zr, including organo-metallic precursors thereof. The dielectric composition may be selected from the group consisting of oxides, nitrides, and oxynitrides. The dielectric material may optionally be a high K dielectric such as, for example, strontium barium titanate or $Ta_2O_5$. For example, the dielectric precursor may include one or more of oxygen, nitrogen, silicon, Al, Zr, Ta, W, Ti, Ba, and Sr.

The polymer may be selected from any of a number of film-forming polymer materials including polymers from the group consisting of polytetrafluoroethylene, polyether ketone, polyamide, Nylon, polyester, polyvinyl chloride, polycaprolactone, and polyvinylacetate. Preferably, the polymer film has a thickness which is thin enough to permit rapid diffusion of the reactants through the film and yet have sufficient strength to span any gaps in the surface of the underlying semiconductor substrate. Typically, the thickness of the polymer film will be from between about 0.01 to about 0.20 mm.

In another embodiment of the invention, a method for depositing one or more materials on a substrate and includes providing a semiconductor substrate, applying a polymer film to at least a portion of a surface of the substrate, and exposing the semiconductor substrate to a supercritical fluid containing at least one metal-containing reactant for a time sufficient for the supercritical fluid to swell the polymer and for the at least one reactant to penetrate the polymer film. The at least one metal-containing reactant is caused to react to deposit a metal-containing material on at least a portion of the substrate. The substrate is removed from the supercritical fluid, and the polymer film is removed from the substrate.

In another embodiment, a method for depositing one or more materials on a substrate a method for depositing one or more materials on a substrate and includes providing a semiconductor substrate, applying a polymer film to at least a portion of a surface of the substrate, and exposing the semiconductor substrate to a supercritical fluid containing at least one dielectric precursor reactant for a time sufficient for the supercritical fluid to swell the polymer and for the at least one dielectric precursor reactant to penetrate the polymer film. The at least one dielectric precursor reactant is caused to react to deposit a dielectric material on at least a portion of the substrate. The substrate is removed from the supercritical fluid, and the polymer film is removed from the substrate.

The method permits the selective deposition of a desired material, either a metal or electrically-conductive material or a dielectric material, onto the surface, or into topographical features of a semiconductor substrate. The polymer film, when exposed to a supercritical fluid, swells and becomes porous to the passage of the desired material. The material may then be reacted and deposited using conventional techniques such as oxidation, reduction, or hydrolysis. The material fills any trenches, contact holes, or other topographic features. When the polymer film is stripped away, any excess material is also removed with the film. There is no need for excess material removal by chemical or physical planarization techniques.

Accordingly, it is a feature of embodiments of the present invention to provide processes in which materials are deposited to fill or cover a desired substrate topography to a precise depth or thickness without the need to remove excess deposited material using chemical and/or physical planarization techniques. This and other features and advantages f embodiments of the invention will become apparent from the following detailed description, the accompanying drawings, and the appended claims.

BRIEF DESCRIPTION OF THE DRAWINGS

The following drawings illustrate schematically features of preferred embodiments of the present invention. The drawings are not necessarily to scale, and the relative sizes of certain elements have been altered to aid in the understanding of the invention.

DETAILED DESCRIPTION OF THE PREFERRED EMBODIMENTS

Figure 1:
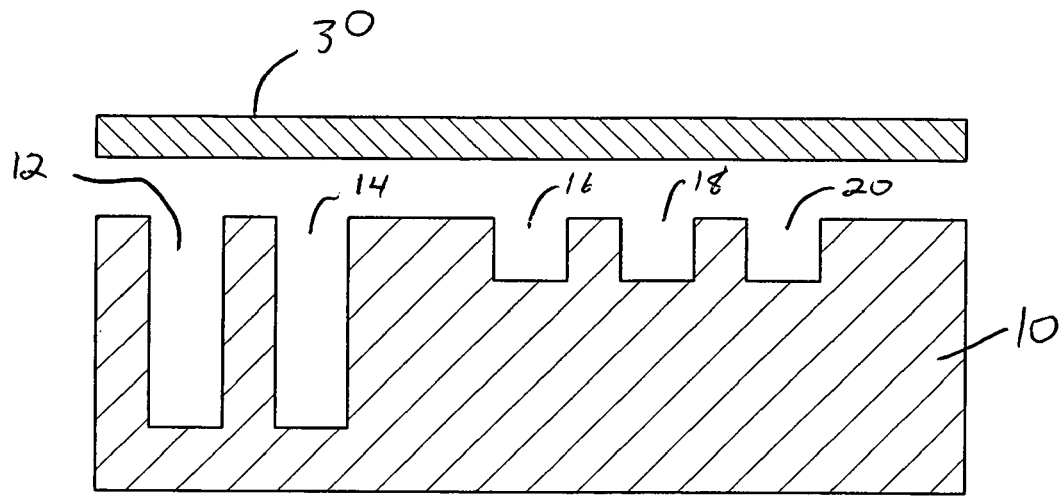
FIG. 1 is a diagrammatic, cross-sectional view of a semiconductor device shown at an intermediate stage of processing/fabrication.

In particular applications, embodiments of the invention are effective to selectively deposit one or more materials on a substrate. In particular, embodiments of the invention are suitable to form metal-containing films over semiconductor substrates, to fill trenches, features, or other gaps or openings with metal-containing materials, and to form dielectric films over semiconductor substrates. The metal-containing films comprise, for example, one or more of Al, Au, Co, Cr, Cu, Hf, In, Ir, Mo, Ni, Rh, Ru, Sn, Ta, Ti, W and Zr. Dielectric films may comprise, for example, oxides of metals or non-metals, nitrides, and oxynitrides.

The process includes applying a polymer film over and onto at least a portion of the semiconductor substrate. A suitable polymer is one that will swell upon exposure to a supercritical fluid and become porous to the passage of the precursors used to deposit the metal and/or dielectric materials onto the semiconductor substrate. Examples of such suitable polymers include polytetrafluoroethylene, polyether ketone, polyamide, Nylon, polyester, polyvinyl chloride, polycaprolactone, and polyvinylacetate. Generally, the polymer film should have a thickness which permits rapid diffusion of the precursor materials during exposure to the supercritical fluid and yet have sufficient strength to span trenches, features, gaps, and other openings on the surface of the substrate. Preferably, the polymer film has a thickness of from between about 0.01 to about 0.20 mm.

The polymer film should be capable of forming a seal to the substrate surface such that there are no spaces between the film and the substrate surface except in those areas where deposition is desired. Formation of a seal prevents the deposition of undesirable material on the substrate surface which eliminates the need for a later planarization process to remove excess material. To maintain the polymer film in place during processing, an optional adhesive may be used to adhere the film to the surface of the substrate. Alternatively, the polymer film may be processed so that it carries an electrostatic charge to interact with the substrate surface and hold the film in position.

The process includes exposing a surface of the semiconductor substrate to a supercritical fluid. As is known, a supercritical fluid may be any substance that is above its critical temperature ($T_c$) and critical pressure ($P_c$). $T_c$ is the highest temperature at which a gas can be converted to a liquid by an increase in pressure, and $P_c$ is the highest pressure at which a liquid can be converted to a traditional gas by an increase in the liquid temperature. In the critical region there is only one phase, and it possesses properties of both gas and liquid. Supercritical fluids differ from traditional liquids in several aspects. For example, the solvent power of a supercritical fluid will typically increase with density at a given temperature. The utilization of supercritical fluid can reduce a temperature at which material are deposited relative to other methods, and yet can enhance a deposition rate of such materials. Additionally, deposition from within a supercritical fluid can allow for infiltration of very small, high aspect ratio features. This may be due to negligible surface tension during deposition and very high diffusivity. Due to the ability to fill high aspect ratio features, deposition from within a supercritical fluid may be used to fill sub-micron nano-features.

In embodiments of the invention that deposit metal-containing materials, the supercritical fluid may contain hydrogen, at least one $H_2$-activating catalyst, and at least metal-containing precursor dispersed and/or dissolved therein. As used herein, the term "supercritical fluid" refers specifically to a portion of a composition that is in a supercritical state (i.e., is utilized to refer to the supercritical component of a composition). Typically, the materials dispersed and/or dissolved within the supercritical fluid will not be in a supercritical state, and accordingly will not be part of the supercritical fluid. However, in particular applications one or more of the materials dispersed within a supercritical fluid can, themselves, be in a supercritical state. In such applications, the dispersed materials that are in the supercritical state will be part of the supercritical fluid.

The supercritical fluid may comprise one or more of $CO_2$, ammonia, $C_1$ through $C_5$ alcohols, $C_2$ through $C_8$ hydrocarbons, water, xenon, nitrous oxide, tetrafluoromethane, difluoromethane, tetrafluoroethane, pentafluoroethane, sulfur hexafluoride, CFC-12, HCFC-22, HCFC-123, HFC-116, HFC-134a, dimethylether, and mixtures thereof. Exemplary $C_1$ to $C_5$ alcohols include ethanol and methanol. In preferred embodiments, the supercritical fluid comprises $CO_2$. An advantage of utilizing $CO_2$, as opposed to other supercritical fluids, is that $CO_2$ has a relatively low critical temperature of 304.13K (31° C.).

The metal-containing precursor utilized in certain embodiments of the present invention comprises a metal (such as, for example, Al, Au, Co, Cr, Cu, Hf, In, Ir, Mo, Ni, Rh, Ru, Sn, Ta, Ti, W and/or Zr) in combination with a chemical group (which can be referred to as a ligand) which enhances solubility of the metal in the supercritical fluid. Suitable ligands include β-diketones of the general formula $R_1C(O)CH_2C(O)R_2$, in which $R_1$ and $R_2$ may comprise fluorinated or non-fluorinated alkyl groups. Exemplary β-diketones are acetylacetone, trifluoroacetylacetone, hexafluoro-acetylacetone, thenoyltrifluoroacetone, and heptafluorobutanoylpivaroylmethane. Other suitable ligands include 6,6,7,7,8,8,8-heptafluoro-2,2-dimethyl-3,5-octadionate and tris(2,2,6,6-tetramethyl-3,5-heptanedionate.

An exemplary process is described with reference to FIGS. 1 through 4. Referring to FIG. 1, a portion or fragment of a partially-fabricated semiconductor substrate or device 10 is shown. Substrate 10 may be considered to be a semiconductor substrate, and may comprise a semiconductor material, such as, for example, silicon. Further, substrate 10 can comprise various dielectric materials including, for example, silicon oxides, silicon nitride, or BPSG. Further, substrate 10 may comprise various integrated circuit structures (not shown). Substrate 10 is intended to depict a generic substrate material and is not to be construed as limited to any particular semiconductor material or device.

Thus, for purposes of this description, the terms "substrate" and "semiconductor substrate" are defined to mean any structure comprising one or more semiconductor materials, including, but not limited to, bulk semiconductor materials such as a semiconductor wafer (either alone or in assemblies comprising other materials thereon), and semiconductor material layers (either alone or in assemblies comprising other materials). The term "substrate" refers to any supporting structure, including, but not limited to, the semiconductor substrates described above.

Substrate 10 has a number of surface features, including openings 12 and 14 extending into the substrate as well as shallow trenches 16, 18, and 20. Openings 12 and 14 are depicted as high aspect ratio openings where the ratio of depth of the opening to its width is 4:1 or greater. Openings 16, 18, and 20 depict shallow trenches or gaps. Polymer film 30 is positioned over the openings and then brought into contact with substrate 10 to form a secure seal which holds the film in place during the processing which follows. As described above, polymer film 30 may include an adhesive thereon, or may be electrostatically charged to aid in the formation of the seal with substrate 10.

Figure 2:
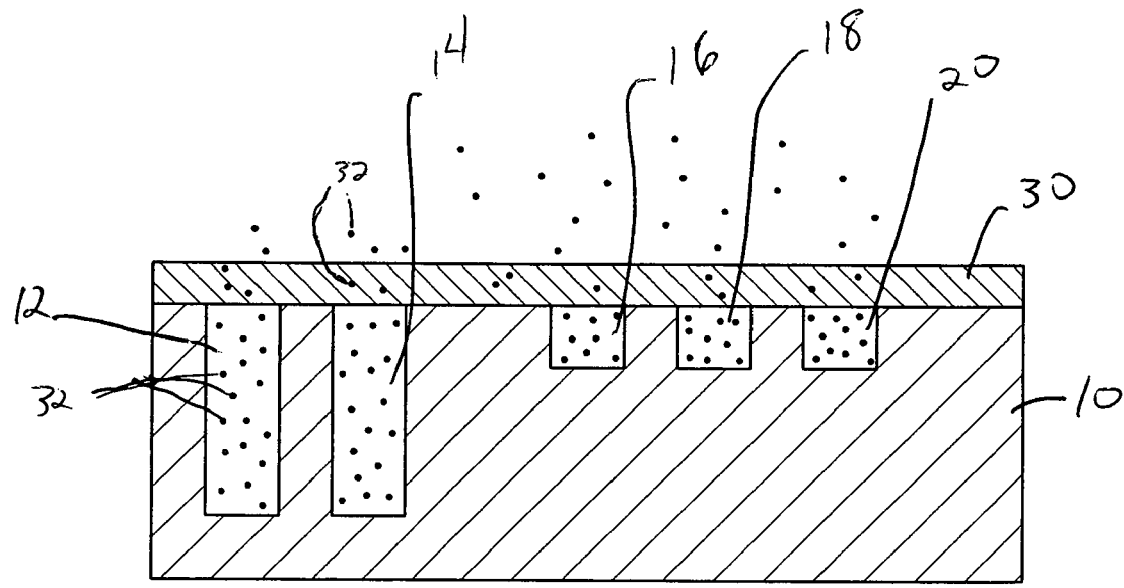
FIG. 2 is a diagrammatic, cross-sectional view of a semiconductor device shown after a polymer film has been applied to the surface of the device and the device has been immersed in a supercritical fluid containing at least one reactant.

Referring to FIG. 2, polymer film 30 has been applied to the surface of substrate 10, and the substrate has been exposed to a supercritical fluid containing at least one reactant. For example, substrate 10 may be placed in a high pressure reactor (not shown) where the temperature and pressure inside the reactor may be controlled in a manner known in the art to maintain the fluid contained therein in a supercritical state. The at least one reactant is depicted as particles 32 for purposes of this description, although it will be recognized that the at least one reactant may be dissolved in the critical fluid. Conditions in the reactor and concentrations of reactants may be as described in commonly-assigned U.S. Pat. No. 6,653,236, the subject matter of which is hereby incorporated by reference herein.

As also shown in FIG. 2, exposure of the polymer film 30 to a supercritical fluid causes the polymer to swell and become porous to the passage of the reactant 32. As depicted, reactant 32 migrates from the bulk supercritical fluid through film 30 and into openings 12, 14 and shallow trenches 16, 18, and 20. As described above, the supercritical fluid may contain a catalyst which enhances the reaction of the reactant to deposit the material in the openings and trenches. Deposition of precursor reactant materials may be accomplished by oxidation, reduction, or hydrolysis reactions as is known in the art. Further, the surfaces of the openings and trenches may be activated or may be treated to have a layer of seed material thereon to enhance the deposition process, improve adhesion of the materials to the substrate surfaces, and insure that the openings are substantially completely filled with deposited material.

Depending on the reactants, the materials to be deposited, the conditions of deposition in the supercritical fluid, and the volume of the openings to be filled, the process may take as little as 30 seconds to several hours. For example, substrates may be batch processed by immersing the substrates in the supercritical fluid for period of from 12-24 hours. The deposited layers may have thicknesses of from only a few Angstroms to several thousand Angstroms. For example, the deposited layers may have thicknesses of from about 10 to about 20,000 Angstroms, and more particularly from about 100 to about 5,000 Angstroms.

Figure 3:
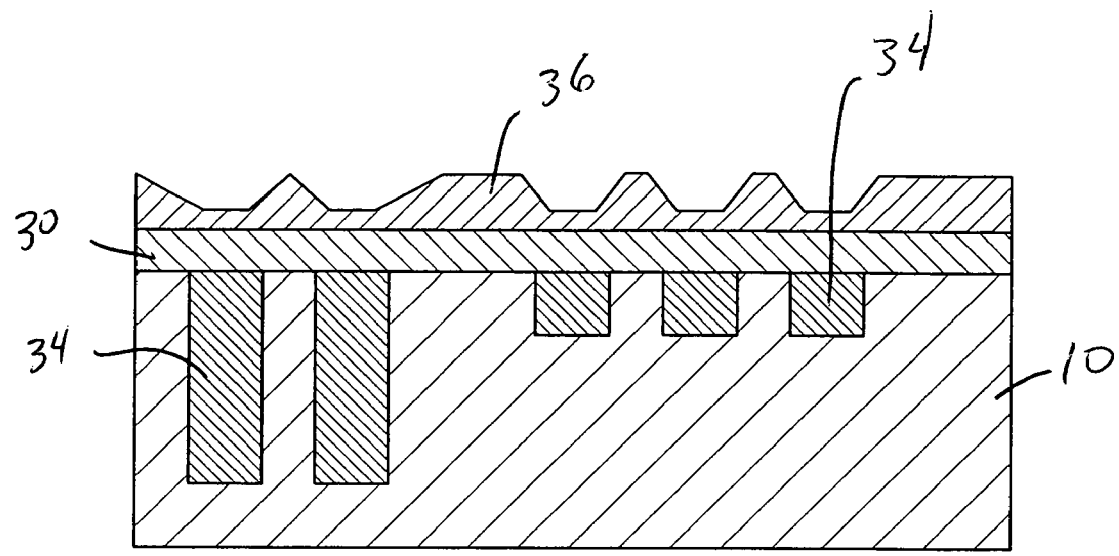
FIG. 3 is a diagrammatic, cross-sectional view of a semiconductor device shown after deposition of one or more materials has taken place.
Figure 4:
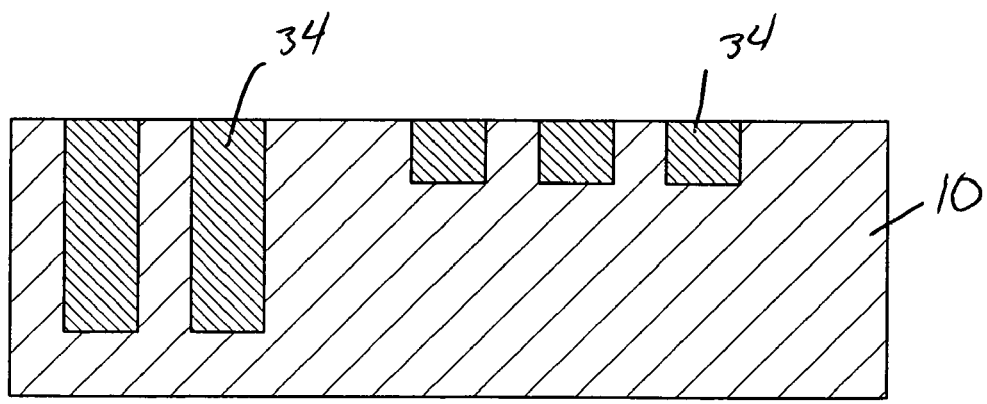
FIG. 4 is a diagrammatic. cross-sectional view of a semiconductor device after removal of the polymer film.

FIG. 3 depicts substrate 10 after completion of the deposition process and removal from the supercritical fluid. As can be seen, openings 12, 14, and trenches 16, 18, and 20 have been substantially completely filled with deposited material 34. Excess material 36 may form on the surface of polymer film 30. FIG. 4 depicts the substrate after polymer film 30 has been stripped away. As can be seen, deposited material 34 fills the openings and is coplanar with the upper surface of substrate 10. Thus, there is no need for further processing to remove excess deposited material as that material has been selectively and precisely deposited to fill the desired openings in substrate 10. This eliminates the need during further fabrication of an semiconductor device for chemical and/or mechanical planarization of the surface of substrate 10. Optionally, if desired, one or more of the filled features containing deposited material 34 may be recessed back to below the upper surface of substrate 10. Recessing may be accomplished using conventional wet or dry etch techniques.

It will be apparent to those skilled in the art that various changes may be made without departing from the scope of the invention which is not considered limited to what is described in the specification.

What is claimed is:

1. A method for depositing one or more materials on a substrate comprising:
   providing a semiconductor substrate; said substrate including at least one trench or contact hole;
   applying a polymer film to at least a portion of a surface of said substrate;
   exposing said semiconductor substrate to a supercritical fluid containing at least one reactant for a time sufficient for said supercritical fluid to swell said polymer and for said at least one reactant to penetrate said polymer film;
   reacting said at least one reactant to deposit a material on at least a portion of said substrate; wherein said material is deposited in said trench or contact hole;
   removing said substrate from said supercritical fluid; and
   removing said polymer film.

2. A method for depositing one or more materials on a substrate comprising:
   providing a semiconductor substrate;
   applying a polymer film, in which said polymer is selected from the group consisting of polytetrafluoroethylene, polyether ketone, polyamide, Nylon, polyester, polyvinyl chloride, polycaprolactone, and polyvinylacetate, to at least a portion of a surface of said substrate;

exposing said semiconductor substrate to a supercritical fluid containing at least one reactant for a time sufficient for said supercritical fluid to swell said polymer and for said at least one reactant to penetrate said polymer film;

reacting said at least one reactant to deposit a material on at least a portion of said substrate;

removing said substrate from said supercritical fluid; and removing said polymer film.

3. A method as claimed in claim 2 in which said supercritical fluid is selected from the group consisting of carbon dioxide, ammonia, $C_1$ through $C_5$ alcohols, $C_2$ through $C_8$ hydrocarbons, water, xenon, nitrous oxide, tetrafluoromethane, difluoromethane, tetrafluoroethane, pentafluoroethane, sulfur hexafluoride, CFC-12, HCFC-22, HCFC-123, HFC-116, HFC-134a, dimethylether, and mixtures thereof.

4. A method as claimed in claim 2 in which said semiconductor substrate includes at least one trench or contact hole.

5. A method as claimed in claim 4 in which said material is deposited in said trench or contact hole.

6. A method as claimed in claim 5 in which said trench or contact hole is substantially filled with said deposited material.

7. A method as claimed in claim 6 including recessing said material so that the upper surface thereof is below the upper surface of the sidewall of the trench or contact hole.

8. A method as claimed in claim 2 in which said at least one reactant comprises a metal-containing composition.

9. A method as claimed in claim 8 in which said metal-containing composition comprises one or more of Al, Au, Co, Cr, Hf, In, Ir, Mo, Ni, Pt, Pd, Rh, Ru, Sn, Ta, Ti, W, and Zr.

10. A method as claimed in claim 2 in which said at least one reactant comprises a dielectric material or a precursor to a dielectric material.

11. A method as claimed in claim 10 in which said dielectric material is selected from the group consisting of oxides, nitrides, and oxynitrides.

12. A method as claimed in claim 10 in which said dielectric precursor material comprises one or more of oxygen, nitrogen, silicon, Al, Zr, Ta, W, Ti, Ba, and Sr.

13. A method as claimed in claim 2 in which said polymer film has a thickness of from between about 0.01 to about 0.20 mm.

14. A method for depositing one or more materials on a substrate comprising:

providing a semiconductor substrate;

applying a polymer film to at least a portion of a surface of said substrate;

exposing said semiconductor substrate to a supercritical fluid containing at least one metal-containing reactant for a time sufficient for said supercritical fluid to swell said polymer and for said at least one metal-containing reactant to penetrate said polymer film;

reacting said at least one metal-containing reactant to deposit a metal-containing material on at least a portion of said substrate;

removing said substrate from said supercritical fluid; and removing said polymer film.

15. A method for depositing one or more materials on a substrate comprising:

providing a semiconductor substrate;

applying a polymer film, in which said polymer is selected from the group consisting of polytetrafluoroethylene, polyether ketone, polyamide, Nylon, polyester, polyvinyl chloride, polycaprolactone, and polyvinylacetate, to at least a portion of a surface of said substrate;

exposing said semiconductor substrate to a supercritical fluid containing at least one metal-containing reactant for a time sufficient for said supercritical fluid to swell said polymer and for said at least one metal-containing reactant to penetrate said polymer film;

reacting said at least one metal-containing reactant to deposit a metal-containing material on at least a portion of said substrate;

removing said substrate from said supercritical fluid; and removing said polymer film.

16. A method as claimed in claim 15 in which said supercritical fluid is selected from the group consisting of carbon dioxide, ammonia, $C_1$ through $C_5$ alcohols, $C_2$ through $C_8$ hydrocarbons, water, xenon, nitrous oxide, tetrafluoromethane, difluoromethane, tetrafluoroethane, pentafluoroethane, sulfur hexafluoride, CFC-12, HCFC-22, HCFC-123, HFC-116, HFC-134a, dimethylether, and mixtures thereof.

17. A method as claimed in claim 15 which said semiconductor substrate includes at least one trench or contact hole.

18. A method as claimed in claim 17 in which said metal-containing material is deposited in said trench or contact hole.

19. A method as claimed in claim 18 in which said trench or contact hole is substantially filled with said deposited metal-containing material.

20. A method as claimed in claim 19 including recessing said metal-containing material so that the upper surface thereof is below the upper surface of the sidewall of the trench or contact hole.

21. A method as claimed in claim 15 in which said metal-containing material comprises one or more of Al, Au, Co, Cr, Hf, In, Ir, Mo, Ni, Pt, Pd, Rh, Ru, Sn, Ta, Ti, W, and Zr.

22. A method as claimed in claim 15 in which said polymer film has a thickness of from between about 0.01 to about 0.20 mm.

23. A method for depositing one or more materials on a substrate comprising:

providing a semiconductor substrate;

applying a polymer film, in which said polymer is selected from the group consisting of polytetrafluoroethylene, polyether ketone, polyamide, Nylon, polyester, polyvinyl chloride, polycaprolactone, and polyvinylacetate, to at least a portion of a surface of said substrate;

exposing said semiconductor substrate to a supercritical fluid containing at least one dielectric precursor reactant for a time sufficient for said supercritical fluid to swell said polymer and for said at least one dielectric precursor reactant to penetrate said polymer film;

reacting said at least one dielectric precursor reactant to deposit a dielectric material on at least a portion of said substrate;

removing said substrate from said supercritical fluid; and removing said polymer film.

24. A method as claimed in claim 23 in which said supercritical fluid is selected from the group consisting of carbon dioxide, ammonia, $C_1$ through $C_5$ alcohols, $C_2$ through $C_8$ hydrocarbons, water, xenon, nitrous oxide, tetrafluoromethane, difluoromethane, tetrafluoroethane, pentafluoroethane, sulfur hexafluoride, CFC-12, HCFC-22, HCFC-123, HFC-116, HFC-134a, dimethylether, and mixtures thereof.

25. A method as claimed in claim 23 in which in which said dielectric precursor reactant comprises one or more of oxygen, nitrogen, silicon, Al, Zr, Ta, W, Ti, Ba, and Sr.

26. A method as claimed in claim 23 in which said dielectric material is selected from the group consisting of oxides, nitrides, and oxynitrides.

27. A method as claimed in claim 23 in which said dielectric material comprises a high K dielectric material.

28. A method as claimed in claim 23 in which said dielectric material is selected from the group consisting of silicon oxides, aluminum oxides, zirconium oxides, tantalum oxides, titanium oxides, barium strontium titanates, and silicon nitrides.

29. A method as claimed in claim 23 in which said polymer film has a thickness of from between about 0.01 to about 0.20 mm.

30. A method for depositing one or more materials on a substrate comprising:
providing a semiconductor substrate;
applying a polymer film to at least a portion of a surface of said substrate;
exposing said semiconductor substrate to a supercritical fluid containing at least one dielectric precursor reactant for a time sufficient for said supercritical fluid to swell said polymer and for said at least one dielectric precursor reactant to penetrate said polymer film;
reacting said at least one dielectric precursor reactant to deposit a dielectric material on at least a portion of said substrate;
removing said substrate from said supercritical fluid; and
removing said polymer film.

31. A method for depositing one or more materials on a substrate comprising:
providing a semiconductor substrate;
applying a polymer film having a thickness of from between about 0.01 to about 0.20 mm to at least a portion of a surface of said substrate; wherein said polymer is selected from the group consisting of polytetrafluoroethylene, polyether ketone, polyamide, Nylon, polyester, polyvinyl chloride, polycaprolactone, and polyvinylacetate;
exposing said semiconductor substrate to supercritical $CO_2$ containing at least one reactant for a time sufficient for said supercritical $CO_2$ to swell said polymer and for said at least one reactant to penetrate said polymer film;
reacting said at least one reactant to deposit a material on at least a portion of said substrate;
removing said substrate from said supercritical $CO_2$; and
removing said polymer film.

32. A method for depositing one or more materials on a substrate comprising:
providing a semiconductor substrate;
applying a polymer film having a thickness of from between about 0.01 to about 0.20 mm to at least a portion of a surface of said substrate;
exposing said semiconductor substrate to supercritical $CO_2$ containing at least one metal-containing reactant for a time sufficient for said supercritical $CO_2$ to swell said polymer and for said at least one metal-containing reactant to penetrate said polymer film;
reacting said at least one metal-containing reactant to deposit a metal-containing material on at least a portion of said substrate;
removing said substrate from said supercritical $CO_2$; and
removing said polymer film.

33. A method for depositing one or more materials on a substrate comprising:
providing a semiconductor substrate;
applying a polymer film having a thickness of from between about 0.01 to about 0.20 mm to at least a portion of a surface of said substrate;
exposing said semiconductor substrate to supercritical $CO_2$ containing at least one dielectric precursor reactant for a time sufficient for said supercritical $CO_2$ to swell said polymer and for said at least one dielectric precursor reactant to penetrate said polymer film;
reacting said at least one dielectric precursor reactant to deposit a dielectric material on at least a portion of said substrate;
removing said substrate from said supercritical $CO_2$; and
removing said polymer film.

* * * * *

UNITED STATES PATENT AND TRADEMARK OFFICE
CERTIFICATE OF CORRECTION

| | | |
|---|---|---|
| PATENT NO. | : 7,582,561 B2 | Page 1 of 1 |
| APPLICATION NO. | : 11/218347 | |
| DATED | : September 1, 2009 | |
| INVENTOR(S) | : Chien M. Wai et al. | |

It is certified that error appears in the above-identified patent and that said Letters Patent is hereby corrected as shown below:

In column 8, line 18, in Claim 17, delete "claim 15 which" and insert -- claim 15 in which --, therefor.

In column 8, line 60, in Claim 25, after "in which" delete "in which".

Signed and Sealed this

Twentieth Day of October, 2009

David J. Kappos
*Director of the United States Patent and Trademark Office*

UNITED STATES PATENT AND TRADEMARK OFFICE
CERTIFICATE OF CORRECTION

PATENT NO. : 7,582,561 B2 Page 1 of 1
APPLICATION NO. : 11/218347
DATED : September 1, 2009
INVENTOR(S) : Wai et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 763 days.

Signed and Sealed this

Fourteenth Day of September, 2010

David J. Kappos
*Director of the United States Patent and Trademark Office*